(12) United States Patent
In

(10) Patent No.: US 9,489,993 B2
(45) Date of Patent: Nov. 8, 2016

(54) SEMICONDUCTOR MEMORY APPARATUS OPTIMIZED FOR SETTING OPERATION PARAMETER AND OPERATING PARAMETER SETTING METHOD THEREOF

(71) Applicant: SK hynix Inc., Icheon-si Gyeonggi-do (KR)

(72) Inventor: Eun Kyu In, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/723,984

(22) Filed: May 28, 2015

(65) Prior Publication Data

US 2016/0276003 A1 Sep. 22, 2016

(30) Foreign Application Priority Data

Mar. 19, 2015 (KR) .......................... 10-2015-0038193

(51) Int. Cl.
*G11C 7/10* (2006.01)
*G11C 7/22* (2006.01)

(52) U.S. Cl.
CPC .. *G11C 7/22* (2013.01); *G11C 7/10* (2013.01)

(58) Field of Classification Search
CPC .................................. G11C 7/22; G11C 7/10
See application file for complete search history.

(56) References Cited

U.S. PATENT DOCUMENTS

| | | | | |
|---|---|---|---|---|
| 2003/0081491 A1* | 5/2003 | Miki | .................... | G11C 7/1078 365/233.1 |
| 2006/0036916 A1* | 2/2006 | Janzen | ................... | G11C 29/46 714/718 |
| 2006/0233030 A1* | 10/2006 | Choi | .................... | G11C 7/1045 365/191 |
| 2007/0162713 A1* | 7/2007 | Schnell | ................ | G11C 7/1078 711/156 |
| 2011/0128810 A1* | 6/2011 | Sato | ........................ | G06F 9/345 365/230.06 |
| 2012/0221825 A1* | 8/2012 | Kim | ........................ | G06F 13/16 711/170 |
| 2014/0355332 A1* | 12/2014 | Youn | ................. | G11C 11/40615 365/149 |

FOREIGN PATENT DOCUMENTS

KR 1020030014378 A 2/2003
KR 1020130047578 A 5/2013

* cited by examiner

*Primary Examiner* — Khamdan Alrobaie
(74) *Attorney, Agent, or Firm* — William Park & Associates Ltd.

(57) ABSTRACT

A semiconductor memory apparatus may include: a memory area; and a controller including a register configured to store parameter setting data, and to provide the parameter setting data to the memory area based on a data transmission enable signal enabled according to a parameter setting command or parameter get command.

19 Claims, 5 Drawing Sheets

SEMICONDUCTOR MEMORY APPARATUS OPTIMIZED FOR SETTING OPERATION PARAMETER AND OPERATING PARAMETER SETTING METHOD THEREOF

CROSS-REFERENCES TO RELATED APPLICATION

The present application claims priority under 35 U.S.C. §119(a) to Korean application number 10-2015-0038193, filed on Mar. 19, 2015, in the Korean Intellectual Property Office, which is incorporated herein by reference in its entirety.

BACKGROUND

1. Technical Field

Various embodiments relate to a semiconductor apparatus, and more particularly, to a semiconductor memory apparatus and an operating method thereof.

2. Related Art

A nonvolatile memory apparatus represented by a flash memory apparatus can be reduced in size and increased in capacity. Furthermore, the nonvolatile memory apparatus has high data processing speed.

Recently, a variety of researches have been continuously conducted to improve the performance of the nonvolatile memory apparatus. In particular, a cache operation has been proposed to support a high-speed operation. When the cache operation is used, data can be processed through a pipeline method during a program or read operation.

The nonvolatile memory device may have different operation characteristics depending on a fabrication process and a usage count. Furthermore, the recent nonvolatile memory apparatuses have been designed to vary the operation characteristics according to devices to which the nonvolatile memory apparatuses are applied, thereby guaranteeing compatibility.

An operation parameter defining an operation characteristic based on an operation mode may be stored in a specific area of the nonvolatile memory apparatus, and a program, erase, or read operation may be performed on the basis of the stored operation parameter. Furthermore, when an event to change an operation parameter occurs, the operation parameter to be changed may be first stored and then read. The program, erase, or read operation is performed according to the changed operation parameter.

SUMMARY

In an embodiment, a semiconductor memory apparatus may include a memory area. The semiconductor memory apparatus may also include a controller including a register configured to store parameter setting data, and to provide the parameter setting data to the memory area based on a data transmission enable signal enabled according to a parameter setting command or parameter get command.

In an embodiment, there is provided an operating method of a semiconductor memory apparatus which includes a memory area and a controller for controlling the memory area. The operating method may include storing parameter setting data. The operating method may also include providing the parameter setting data to the memory area according to a data transmission enable signal enabled in response to a parameter setting command or parameter get command.

In an embodiment, a semiconductor memory apparatus may include a memory area. The semiconductor memory apparatus may also include a controller configured to receive a parameter setting command or a parameter get command, store data or parameter setting data, and output the parameter setting data according to the parameter setting command or the parameter get command.

DETAILED DESCRIPTION

Figure 1:
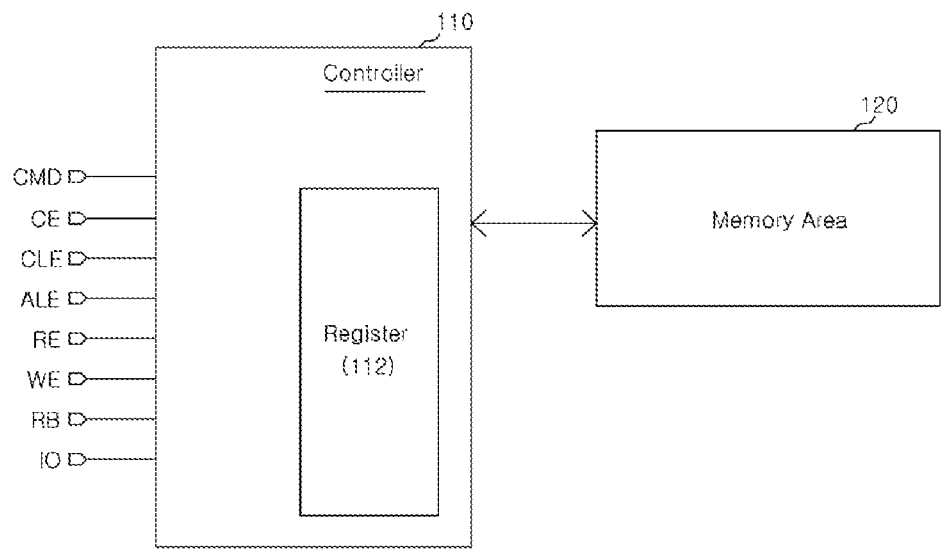
FIG. 1 is a configuration diagram of a semiconductor memory apparatus according to an embodiment of the invention.

Exemplary embodiments will be described in greater detail with reference to the accompanying drawings. Exemplary embodiments are described herein with reference to cross-sectional illustrations that are schematic illustrations of exemplary embodiments and intermediate structures. As such, variations from the shapes of the illustrations as a result of, for example, manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations that are schematic illustrations of exemplary embodiments. However, embodiments should not be limited or construed as limited to the inventive concept. Although a few embodiments will be shown and described, it will be appreciated by those of ordinary skill in the art that changes may be made in these exemplary embodiments without departing from the principles and spirit of the inventive concept.

Referring to FIG. 1, a configuration diagram of a semiconductor memory apparatus according to an embodiment is described.

As illustrated in FIG. 1, the semiconductor memory apparatus 100 may include a controller 110 and a memory area 120.

The controller 110 may control overall operations of the memory area 120 according to a signal provided from outside.

In particular, the controller 110 may receive a command CMD and control signals (CE (Chip Enable), CLE (Command Latch Enable), ALE (Address Latch Enable), RE (Read Enable), WE (Write Enable), and RB (Ready/Busy)) from an external device. The external device may be for example, a host device. The controller 110 may transmit/receive data IO to/from the external device. The controller 110 may decode the command CMD and perform an operation corresponding to the decoding result.

The command CMD inputted to the controller 110 may include a parameter setting command SETPARA and or a parameter get command GETPARA. In this case, according to an address signal and data received after the parameter setting command SETPARA, the controller 110 may store data or parameter setting data in a corresponding area of the register 112 indicated by the address signal.

The parameter setting data stored in the register 112 in response to the parameter setting command SETPARA may be outputted from the register 112 in response to a parameter get command GETPARA. The parameter setting data may also be provided to the memory area 120.

In an embodiment, the register 112 may be implemented with a multi-stage latch or desirably a second-stage latch to support a cache operation. Furthermore, to output the parameter setting data stored in the register 112, a control signal may be required to transmit data of the pre-stage latch to the post-stage latch.

In an embodiment, a data transmission enable signal for controlling the operation of the register 112 may be generated on the basis of a signal enabled when the parameter get command GETPARAT is applied, for example, a parameter read signal READPARA. Accordingly, when the parameter get command GETPARA is applied, the data of the previous-stage latch may be transmitted to the post-stage latch and outputted from the register 112 in response to the parameter read signal READPARA.

In an embodiment, a data transmission enable signal may be generated on the basis of a command applied after the parameter setting command SETPARA is applied, for example, a setup command SETUP. Thus, after the parameter setting data is stored in the register 112 according to the parameter setting command SETPARA, the data of the previous-stage latch may be transmitted to the post-stage latch in response to the setup command SETUP.

In an embodiment, a data transmission enable signal may be generated on the basis of a command applied after the parameter setting command SETPARA is applied, for example, a parameter setting confirm command SETCNFM. In this case, after the parameter setting data is stored in the register 112 according to the parameter setting command SETPARA, the data of the previous-stage latch may be transmitted to the post-stage latch according to the parameter setting confirm command SETCNFM.

In an embodiment, a data transmission enable signal may be generated on the basis of commands applied after the parameter setting command SETPARA is applied, for example, a setup command SETUP and a parameter setting confirm command SETCNFM. In this case, after the parameter setting data is stored in the register 112 according to the parameter setting command SETPARA, the data transmission enable signal may be enabled until the parameter setting confirm command SETCNFM is disabled after the setup command SETUP is applied such that the data of the previous-stage latch can be transmitted to the post-stage latch.

When the parameter setting data is stored and then outputted, the parameter setting data stored in the register 112 may be outputted in response to the parameter setting command SETPARA or the parameter get command GETPARA. As a result, the parameter setting data may be outputted without performing an unnecessary dummy operation for operating the register 112.

The parameter setting command SETPARA may be provided from an external device such as a host, when the operation characteristic of the semiconductor memory apparatus 100 needs to be changed, but is not limited as such.

The memory area 120 may include a semiconductor memory cell array and an access circuit unit for the semiconductor memory cell array. The access circuit unit may include a row control unit, a column control unit, an input/output circuit unit, a voltage providing unit and the like.

In an embodiment, the memory cell array may include a plurality of blocks. In addition, a plurality of semiconductor memory cells included in each of the blocks may be electrically coupled through a string structure between word lines WL and bit lines BL. The memory cells forming the memory cell array may include flash memory cells, for example. The memory cells may be implemented with single level cells or multi-level cells.

The semiconductor memory apparatus may include one or more memory areas 120.

Figure 2:
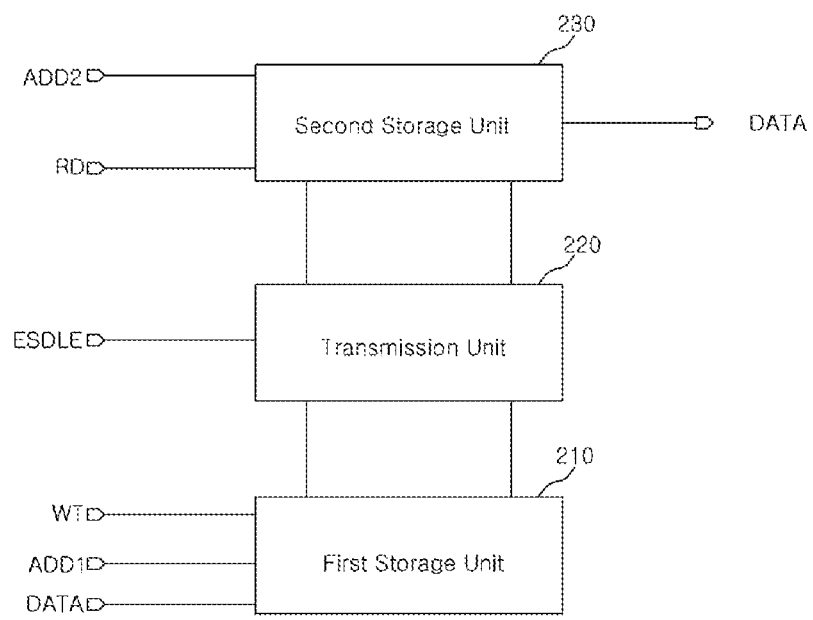
FIG. 2 is a configuration diagram of a register according to an embodiment.

Referring to FIG. 2, a configuration diagram of the register according to an embodiment is shown.

As illustrated in FIG. 2, the register 200 may include a first storage unit 210, a transmission unit 220, and a second storage unit 230.

The first storage unit 210 may be enabled as position information for storing parameter setting data, that is, a first address signal ADD1 is provided from an external device such as a host. Furthermore, the first storage unit 210 may store data DATA, that is, parameter setting data according to a write signal WT generated in response to the parameter setting command SETPARA.

The transmission unit 220 may transmit the data DATA of the first storage unit 210 to the second storage unit 230 in response to a data transmission enable signal ESDLE.

The second storage unit 230 may be enabled as position information for storing parameter setting data, that is, a second address signal ADD2 is provided from an external device such as a host. Furthermore, the second storage unit 230 may output the data DATA transmitted through the transmission unit 220 according to a read signal RD generated according to the parameter get command GETPARA.

Figure 3:
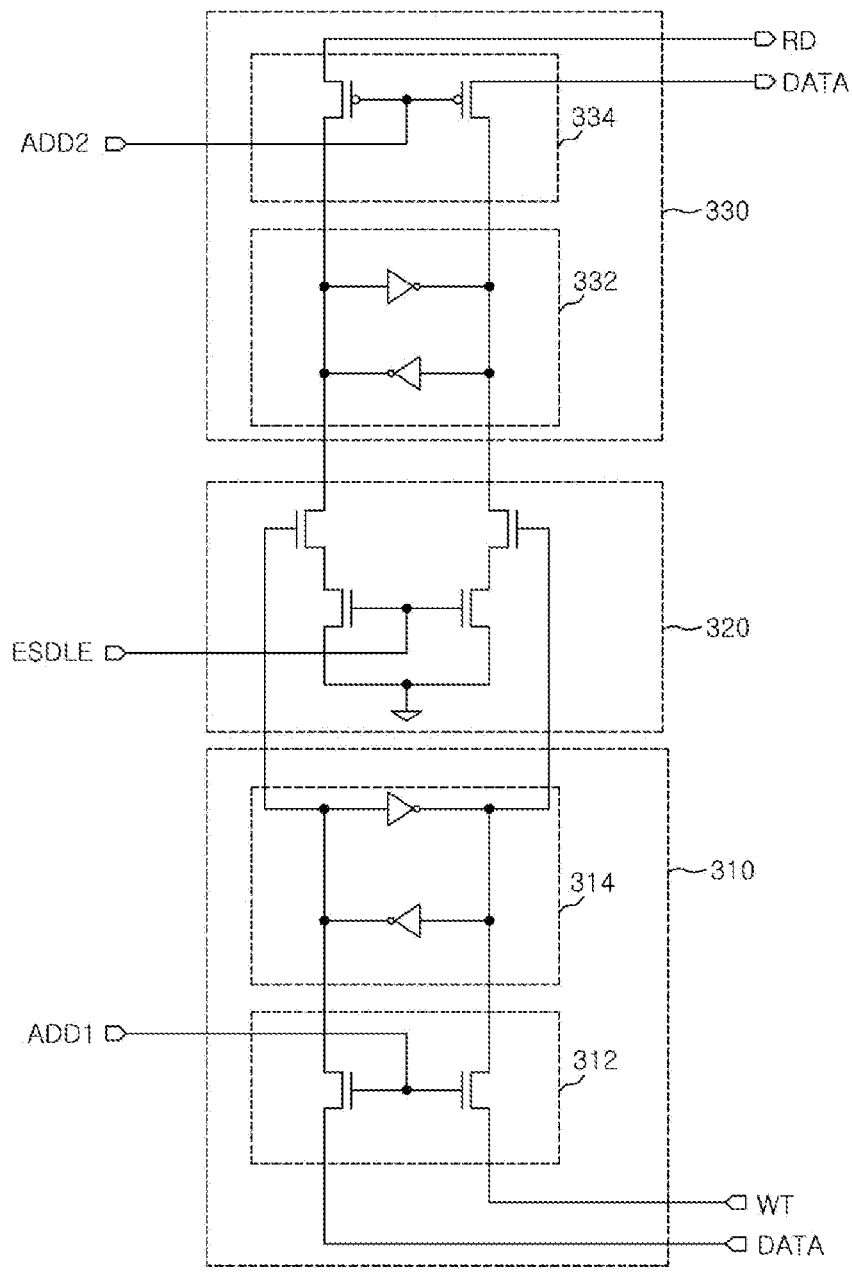
FIG. 3 is a circuit diagram of a register according to an embodiment.

Referring to FIG. 3, a circuit diagram of the register according to an embodiment is shown.

As illustrated in FIG. 3, the register 300 may include a first storage unit 310, a transmission unit 320, and a second storage unit 330.

The first storage unit 310 may include an input unit 312 and a first latch 314. The second storage unit 330 may include a second latch 332 and an output unit 334.

More specifically, the input unit 312 may be enabled as the first address signal ADD1 is provided. The input unit 312 may also apply a write signal WT and data DATA to the first latch 314. The first latch 314 may temporarily store the write signal WT and the data DATA provided from the input unit 312.

The transmission unit 320 may be driven in response to a data transmission enable signal ESDLE. Furthermore, the transmission unit 320 may output the read signal RD corresponding to the write signal WT of the first latch 314 and data DATA corresponding to the data DATA of the first latch 314.

Figure 4:
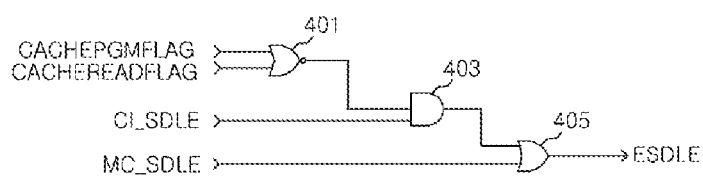
FIG. 4 is a configuration diagram of a data transmission enable signal generation circuit according to an embodiment of the invention.

Referring to FIG. 4, a configuration diagram of a data transmission enable signal generation circuit according to an embodiment is described.

As described above, the data transmission enable signal ESDLE may be enabled according to the parameter setting command SETPARA or the parameter get command GETPARA.

In an embodiment, the data transmission enable signal generation circuit may generate a parameter output control signal CI_SDLE in response to the parameter setting command SETPARA or the parameter get command GETPARA. The data transmission enable signal generation circuit may also generate the data transmission enable signal ESDLE in response to the parameter output control signal CL_SDLE. FIG. 4 illustrates an example of the configuration.

When the register 112, 200, or 300 is not performing a cache operation, the data transmission enable signal generation circuit 400 may enable the data transmission enable signal ESDLE regardless of an original control signal MC_SDLE in case where the parameter output control signal CI_SDLE is enabled.

In an embodiment, the data transmission enable signal generation circuit 400 may include a cache operation determination unit 401, a parameter output determination unit 403, and a data transmission determination unit 405.

The cache operation determination unit 401 may determine whether the register 112, 200, or 300 is performing a cache operation. When the register 112, 200, or 300 is not performing a cache operation, a flag signal CACHEPGMFLAG or CACHEREADFLAG may have a logic low state, the flag signal CACHEPGMFLAG or CACHEREADFLAG indicating whether to perform a program or read operation for the register 112, 200, or 300. Accordingly, when a cache operation is not performed, an output signal of the cache operation determination unit 401 implemented with a NOR gate may have a logic high level.

The parameter output determination unit 403 may determine whether to output a parameter in response to the output signal of the cache operation determination unit 401 and the parameter output control signal CI_SDLE. When the parameter needs to be outputted as the parameter setting command SETPARA or the parameter get command GETPARA is applied, the parameter output control signal CI_SDLE may have a logic high level. Thus, an output signal of the parameter output determination unit 403 implemented with an AND gate may have a logic high level.

The data transmission determination unit 405 may generate the data transmission enable signal ESDLE in response to the output signal of the parameter output determination unit 403 and the original control signal MC_SDLE. When an output signal of the data transmission determination unit 405 is at a logic high level, or, when the register 112, 200, or 300 is not performing a cache operation but the parameter output control signal CI_SDLE has a logic high level, the data transmission enable signal ESDLE may be outputted at a logic high level regardless of the original control signal MC_SDLE. For this operation, the data transmission determination unit 405 may be implemented with an OR gate, but is not limited to such a configuration.

Figure 5:
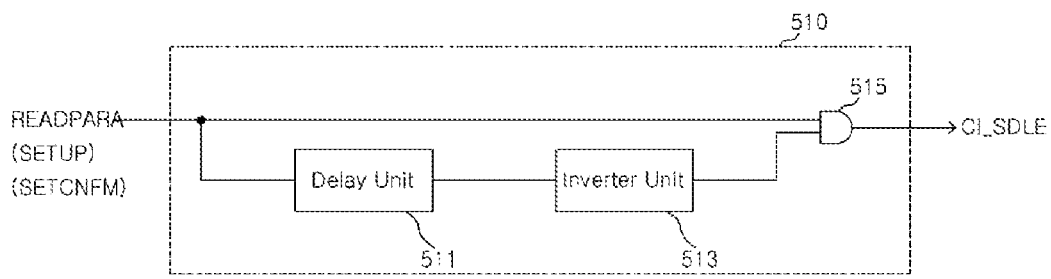
FIGS. 5 and 6 are configuration diagrams of parameter output control signal generation circuits according to embodiments of the invention.
Figure 6:
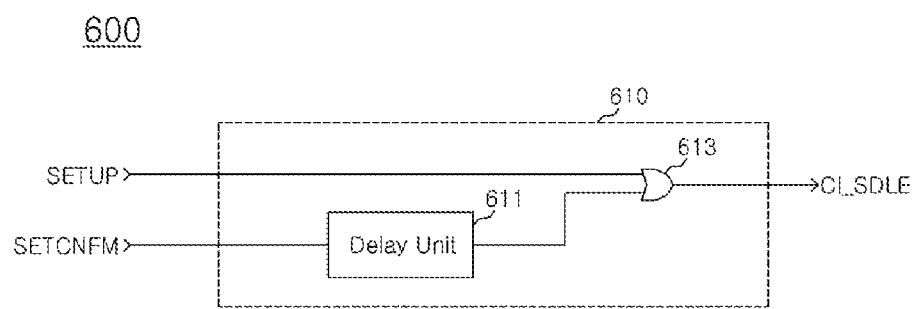

Referring to FIGS. 5 and 6, configuration diagrams of parameter output control signal generation circuits according to embodiments are shown.

As described above, the parameter output control signal CI_SDLE may be generated on the basis of the parameter read signal READPARA generated in response to the parameter get command GETPARA; the setup command SETUP applied in response to the parameter setting command SETPARA; the parameter setting confirm command SETCNFM applied in response to the parameter setting command SETPARA; or the setup command SETUP and the parameter setting confirm command SETCNFM which are applied in response to the parameter setting command SETPARA.

First, FIG. 5 illustrates an example in which the parameter output control signal generation circuit generates the parameter output control signal CI_SDLE according to the parameter read command READPARA, the setup command SETUP, or the parameter setting confirm command SETCNFM. Further, a signal enabled in response to the parameter get command GETPARA includes the parameter read command READPARA.

The parameter output control signal generation circuit 500 may include a pulse generation unit 510 which receives the parameter read command READPARA, the setup command SETUP, or the parameter setting confirm command SETCNFM as a first input signal. The parameter output control signal generation circuit 500 may also generate the parameter output control signal CI_SDLE from a delayed inverted signal of the first input signal.

The first input signal READPARA, SETUP, or SETCNFM may be delayed and inverted by a delay unit 511 and an inverter unit 513 and generated as a second input signal.

The first input signal READPARA, SETUP, or SETCNFM and the second input signal as an output signal of the inverter unit 513 may be inputted to a logic circuit unit 515. When both of the two input signals are at a high level, the logic circuit unit 515 may output the parameter output control signal CI_SDLE at a logic high level. In an embodiment, the logic circuit unit 515 may be implemented with an AND gate, but is not limited to such a configuration.

FIG. 6 illustrates an example in which the parameter output control signal generation circuit generates the parameter output control signal CI_SDLE according to the setup command SETUP and the parameter setting confirm command SETCNFM.

The parameter output control signal generation circuit 600 may include a pulse generation unit 610 which enables the parameter output control signal CI_SDLE until the parameter setting confirm command SETCNFM is disabled after the setup command SETUP is enabled.

The second input signal SETCNFM may be delayed by a preset time through a delay unit 611 and provided to a logic circuit unit 613. At this time, the first input signal SETUP may be provided to the logic circuit unit 613 together with the second input signal SETCNFM. At a period in which both of the two input signals are not at a low level, the logic circuit unit 613 may output the parameter output control signal CI_SDLE at a logic high level. In an embodiment, the logic circuit unit 613 may be implemented with an OR gate, but is not limited to such a configuration.

As such, when the parameter setting data is stored and outputted, the parameter output control signal CI_SDLE may be generated according to the parameter setting command SETPARA or the parameter get command GETPARA. Then, when the register 112, 200, or 300 is not performing a cache operation, the data transmission enable signal ESDLE may be enabled according to the parameter output control signal CI_SDLE. Furthermore, the parameter setting data stored in the register 112, 200, or 300 may be outputted in response to the enabled data transmission enable signal ESDLE. Accordingly, the semiconductor memory apparatus can output the parameter setting data without performing an unnecessary dummy operation for operating the register 112, 200, or 300.

Figure 7:
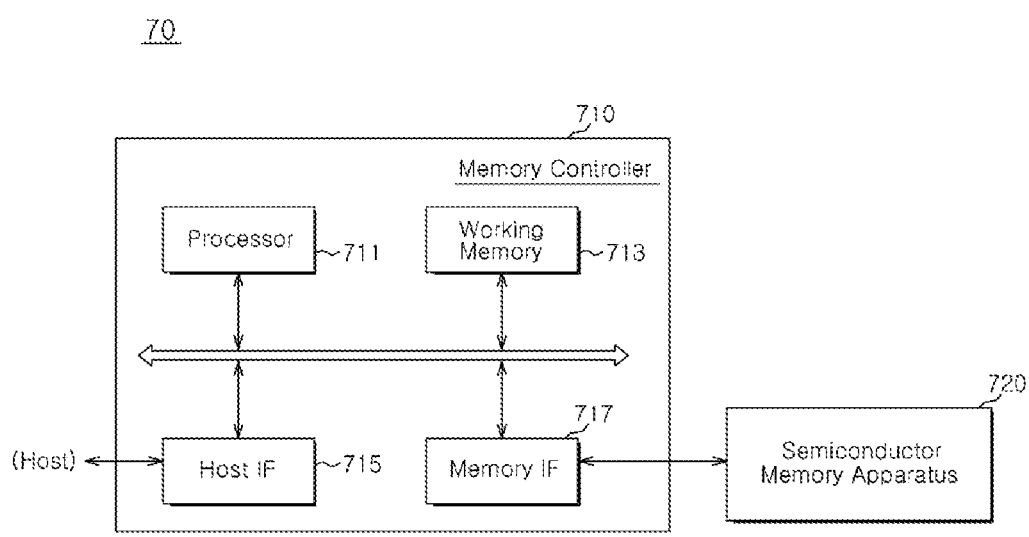
FIG. 7 is a configuration diagram of a data processing system according to an embodiment of the invention.

Referring to FIG. 7, a configuration diagram of a data processing system according to an embodiment is described.

The data processing system 70 illustrated in FIG. 7 may include a memory controller 710 and a semiconductor memory apparatus 720.

The memory controller 710 may be configured to access the semiconductor memory apparatus 720 according to a request of a host. For this operation, the memory controller 710 may include a processor 711, a working memory 713, a host interface 715, and a memory interface 717.

The processor 711 may control overall operations of the memory controller 710. Further, the working memory 713 may store applications, data, and control signals required for the operations of the memory controller 710.

The host interface 715 may perform protocol conversion to exchange data/control signals between the host and the memory controller 710. In addition, the memory interface 717 may perform protocol conversion to convert data/control signals between the memory controller 710 and the semiconductor memory apparatus 720.

The semiconductor memory apparatus 720 may include the semiconductor memory apparatus including the register illustrated in FIGS. 1 to 6, for example. The semiconductor memory apparatus 720 may include a memory cell array having semiconductor memory elements, an address decoder, a controller, a voltage generator and the like. Accordingly, according to a parameter change command from the host, the semiconductor memory apparatus 720 may store parameter setting data in the register. The semiconductor memory apparatus 720 may also output the parameter setting data stored in the register in response to the parameter setting command SETPARA or the parameter get command GETPARA.

The data processing system illustrated in FIG. 7 may be used as a disk device, an internal/external memory card of a portable electronic device, an image processor, or other application chipsets or the like.

The working memory provided in the memory controller 710 may also be implemented with the semiconductor memory apparatus illustrated in FIGS. 1 to 6 shown above.

Figure 8:
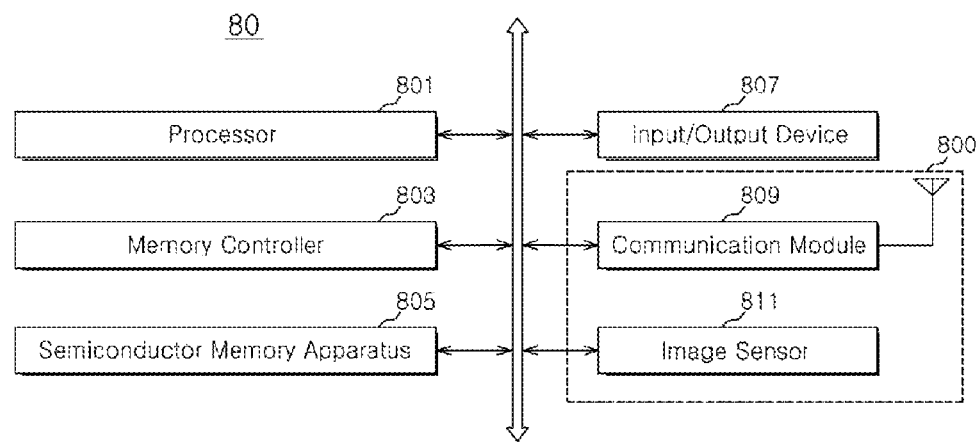
FIGS. 8 and 9 are configuration diagrams of electronic systems according to embodiments.
Figure 9:
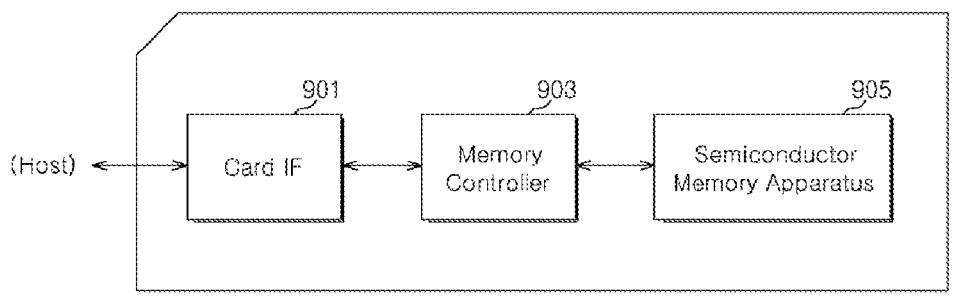

Referring to FIGS. 8 and 9, configuration diagrams of electronic systems according to embodiments are described.

First, the electronic system 80 illustrated in FIG. 8 may include a processor 801, a memory controller 803, a semiconductor memory apparatus 805, an input/output device 807, and a function module 800.

The memory controller 803 may control a data processing operation of the semiconductor memory apparatus 805, for example, a program or read operation according to control of the processor 801.

Data programmed in the semiconductor memory apparatus 805 may be outputted through the input/output device 807 according to control of the processor 801 and the memory controller 803. For this operation, the input/output device 807 may include a display device, a speaker device and the like.

Furthermore, the input/output device 807 may include an input device through which a control signal for controlling the operation of the processor 801 or data to be processed by the processor 801 can be inputted.

In an embodiment, the memory controller 803 may be implemented as a part of the processor 801. The memory controller 803 may also be implemented as a separate chip set from the processor 801.

The semiconductor memory apparatus 805 may include a memory cell array having semiconductor memory elements, an address decoder, a controller, a voltage generator and the like. In an embodiment, the semiconductor memory apparatus 805 may include the semiconductor memory apparatus having the register illustrated in FIGS. 1 to 6 described above. Thus, according to a parameter change command from the host, the semiconductor memory apparatus 805 may store parameter setting data in the register. The semiconductor memory apparatus 805 may also output the parameter setting data stored in the register in response to the parameter setting command SETPARA or the parameter get command GETPARA.

The function module 800 may include a module capable of performing a selected function according to an application example of the electronic system 80 illustrated in FIG. 8. FIG. 8 illustrates a communication module 809 and an image sensor 811 as an example of the function module 800.

The communication module 809 may provide a communication environment in which the electronic system 80 can exchange data and control signals through a wired or wireless communication network.

The image sensor 811 may convert an optical image into digital image signals. The image sensor 811 may also transmit the digital image signals to the processor 801 and the memory controller 803.

When the electronic system 80 includes the communication module 809, the electronic system 80 of FIG. 8 may be used as a portable communication device such as a wireless communication terminal. When the electronic system 80 includes the image sensor 811, the electronic system 80 may be used as an electronic system to which a digital camera, a digital camcorder, or one of the digital camera and the digital camcorder is attached. The electronic system may include a PC, notebook computer, or mobile communication terminal or the like.

Referring to FIG. 9, the electronic system 90 illustrated in FIG. 9 may include a card interface 901, a memory controller 903, and a semiconductor memory apparatus 905.

FIG. 9 illustrates an example of a memory card or smart card. The electronic system 90 of FIG. 9 may be used as any one of a PC card, a multimedia card, an embedded multimedia card, a secure digital card, and a USB drive.

The card interface 901 may interface data exchange between a host and the memory controller 903 according to a protocol of the host. In an embodiment, the card interface 901 may indicate hardware capable of supporting the protocol used by the host. The card interface 901 may also indicate software mounted on the hardware capable of supporting the protocol used by the host. The card interface 901 may also indicate a signal transmission scheme.

The memory controller 903 may control data exchange between the semiconductor memory apparatus 905 and the card interface 901.

The semiconductor memory apparatus 905 may include the semiconductor memory apparatus having the register illustrated in FIGS. 1 to 6. The semiconductor memory apparatus 905 may include a memory cell array having semiconductor memory elements, an address decoder, a controller, a voltage generator and the like. Thus, according to a parameter change command from the host, the semiconductor memory apparatus 905 may store parameter setting data in the register. The semiconductor memory apparatus 905 may also output the parameter setting data stored in the register in response to the parameter setting command SETPARA or the parameter get command GETPARA.

While certain embodiments have been described above, it will be understood to those skilled in the art that the embodiments described are by way of examples only. Accordingly, the semiconductor memory apparatus described should not be limited based on the described embodiments above. Rather, the semiconductor memory apparatus described should only be limited in light of the claims that follow when taken in conjunction with the above description and accompanying figures.

What is claimed is:

1. A semiconductor memory apparatus comprising:
   a memory area; and
   a controller including a register configured to store parameter setting data, and to provide the parameter setting data to the memory area based on a data transmission enable signal enabled according to a parameter setting command or parameter get command,
   wherein the register comprises:
   a first storage unit configured to store the parameter setting data according to the parameter setting command and a first address signal;
   a second storage unit configured to output the parameter setting data according to the parameter get command and a second address signal; and
   a transmission unit configured to transmit the parameter setting data stored in the first storage unit to the second storage unit, based on the data transmission enable signal enabled in response to the parameter setting command or the parameter get command.

2. The semiconductor memory apparatus according to claim 1, wherein the data transmission enable signal is generated according to a signal enabled in response to the parameter get command.

3. The semiconductor memory apparatus according to claim 2, wherein the signal enabled in response to the parameter get command includes a parameter read command.

4. The semiconductor memory apparatus according to claim 1, wherein the data transmission enable signal is generated according to a signal enabled in response to the parameter setting command.

5. The semiconductor memory apparatus according to claim 4, wherein the signal enabled in response to the parameter setting command includes a setup command.

6. The semiconductor memory apparatus according to claim 4, wherein the signal enabled in response to the parameter setting command includes a parameter setting confirm command.

7. The semiconductor memory apparatus according to claim 1, wherein the data transmission enable signal is generated according to a plurality of signals enabled in response to the parameter setting command.

8. The semiconductor memory apparatus according to claim 7, wherein the plurality of signals enabled in response to the parameter setting command comprise a setup command and a parameter setting confirm command.

9. An operating method of a semiconductor memory apparatus which includes a memory area and a controller for controlling the memory area, the operating method comprising:
   storing parameter setting data; and
   providing the parameter setting data to the memory area according to a data transmission enable signal enabled in response to a parameter setting command or parameter get command,
   wherein the step of providing the parameter setting data to the memory area comprises the steps of:
   storing the parameter setting data in a first storage unit in response to the parameter setting command and a first address signal;
   transmitting the parameter setting data stored in the first storage unit to a second storage unit based on the data transmission enable signal enabled in response to the parameter setting command or the parameter get command; and
   outputting data transmitted to the second storage unit to the memory area.

10. The operating method according to claim 9, wherein the data transmission enable signal is generated according to a signal enabled in response to the parameter get command.

11. The operating method according to claim 10, wherein the signal enabled in response to the parameter get command includes a parameter read command.

12. The operating method according to claim 9, wherein the data transmission enable signal is generated according to a signal enabled in response to the parameter setting command.

13. The operating method according to claim 12, wherein the signal enabled in response to the parameter setting command comprises a setup command.

14. The operating method according to claim 12, wherein the signal enabled in response to the parameter setting command comprises a parameter setting confirm command.

15. The operating method according to claim 9, wherein the data transmission enable signal is generated according to a plurality of signals enabled in response to the parameter setting command.

16. The operating method according to claim 15, wherein the plurality of signals enabled in response to the parameter setting command comprise a setup command and a parameter setting confirm command.

17. A semiconductor memory apparatus comprising:
    a memory area: and
    a controller configured to receive a parameter setting command or a parameter get command, store data or parameter setting data, and output the parameter setting data according to the parameter setting command or the parameter get command,
    wherein the controller comprises:
    a first storage unit configured to store the parameter setting data according to the parameter setting command and a first address signal;
    a second storage unit configured to output the parameter setting data according to the parameter get command and a second address signal; and
    a transmission unit configured to transmit the parameter setting data stored in the first storage unit to the second storage unit, based on a data transmission enable signal enabled in response to the parameter setting command or the parameter get command.

18. The semiconductor memory apparatus according to claim 17, further comprising:
    a register including a multi-stage latch and configured to support a cache operation.

19. The semiconductor memory apparatus according to claim 17, wherein a data transmission enable signal is enabled until a parameter setting confirm command is disabled.

* * * * *